(12) United States Patent
Rao

(10) Patent No.: US 8,179,028 B1
(45) Date of Patent: May 15, 2012

(54) PREVENTION OF CORE FAILURES IN LARGE ELECTRIC MACHINES

(76) Inventor: Dantam K. Rao, Schenectady, NY (US)

( * ) Notice: Subject to any disclaimer, the term of this patent is extended or adjusted under 35 U.S.C. 154(b) by 0 days.

(21) Appl. No.: 13/205,609

(22) Filed: Aug. 8, 2011

(51) Int. Cl.
*H02K 1/18* (2006.01)

(52) U.S. Cl. ................... 310/433; 310/216.129

(58) Field of Classification Search .......... 310/216.051, 310/216.052, 216.049, 216.086, 216.087, 310/216.088, 216.089, 216.125, 216.126, 310/216.127, 154.17, 154.18, 154.19, 156.18, 310/156.19, 156.22, 432, 433, 258, 254.1, 310/427, 154.41, 156.08, 156.21, 216.01, 310/216.003, 216.058; *H02K 1/18, 1/06*
See application file for complete search history.

(56) References Cited

U.S. PATENT DOCUMENTS

| | | | | | |
|---|---|---|---|---|---|
| 1,980,026 | A | * | 11/1934 | Wood | 310/433 |
| 2,849,695 | A | * | 8/1958 | Schaefer | 336/210 |
| 2,945,140 | A | * | 7/1960 | Drabik et al. | 310/214 |
| 3,343,013 | A | * | 9/1967 | Wightman et al. | 310/216.132 |
| 3,807,040 | A | * | 4/1974 | Otto | 29/596 |
| 3,867,654 | A | * | 2/1975 | Otto | 310/216.132 |
| 4,494,030 | A | | 1/1985 | Mulach et al. | |
| 4,564,779 | A | | 1/1986 | Terry | |
| 4,568,572 | A | | 2/1986 | Lee et al. | |
| 4,837,471 | A | | 6/1989 | Kostoss et al. | |
| 4,879,485 | A | * | 11/1989 | Tassinario | 310/156.19 |
| 5,032,826 | A | | 7/1991 | Miller et al. | |
| 5,252,915 | A | | 10/1993 | Sadding et al. | |
| 5,336,560 | A | | 8/1994 | Spence et al. | |
| 6,333,103 | B1 | | 12/2001 | Ishi et al. | |
| 6,448,686 | B1 | | 9/2002 | Dawson et al. | |
| 6,462,457 | B2 | | 10/2002 | Shah et al. | |
| 6,597,081 | B2 | | 7/2003 | Dawson et al. | |
| 6,713,930 | B2 | | 3/2004 | Shah et al. | |
| 6,720,699 | B1 | | 4/2004 | Shah et al. | |
| 6,756,788 | B2 | | 6/2004 | Kliman et al. | |
| 6,775,900 | B2 | | 8/2004 | Dawson et al. | |
| 6,865,797 | B2 | | 3/2005 | Walko et al. | |
| 6,933,648 | B2 | * | 8/2005 | Buchan et al. | 310/214 |
| 6,949,858 | B2 | | 9/2005 | White et al. | |
| 7,113,899 | B2 | | 9/2006 | Shaw et al. | |
| 7,202,587 | B2 | * | 4/2007 | Sargeant et al. | 310/418 |
| 7,397,163 | B2 | | 7/2008 | Cook et al. | |
| 7,455,918 | B2 | | 11/2008 | Gates et al. | |
| 7,692,348 | B2 | * | 4/2010 | Gruenhagen | 310/156.19 |
| 7,888,835 | B2 | * | 2/2011 | Yang et al. | 310/156.19 |
| 2010/0320865 | A1 | * | 12/2010 | Bauch et al. | 310/216.134 |

(Continued)

OTHER PUBLICATIONS

Tavner et al, Core faults in large generators, IEE Proc. Elec. Pwer Appl. vol. 152, No. 6, Nov. 2005, 1428-1439.

(Continued)

*Primary Examiner* — Quyen Leung
*Assistant Examiner* — Thomas Truong

(57) ABSTRACT

The keybar that is attached to the frame of a dynamoelectric machine is broken into a bald keybar with mini-dovetails attached to it. The bald keybar is identical to the bolt portion of a conventional keybar. The mini-dovetail is a trapezoidal or U-shaped strip with insulated slanted arms. The core packet is inserted loosely over an array of mini-dovetails. Devices such as wedges, threaded rods flex the slanted arm and press them against the slot faces of the core packet, thereby locking the core packet to the frame. Insulation on the slanted arms prevents large eddy currents due to shorted laminations, increasing the machine efficiency. Preventing large eddy currents also eliminates hot spots which could otherwise cause a core failure. Locking the core packets also prevents rattling of laminations. The locking method also distributes the torque forces evenly around the periphery.

10 Claims, 6 Drawing Sheets

U.S. PATENT DOCUMENTS

2011/0109187 A1     5/2011    Tanavde et al.

OTHER PUBLICATIONS

Spisak, A. Generator core overheating risk assessment, EPRI Publication No. 1009855, May 2004.

Edmonds, J. et al, Turbogenerator stator core study, Int. Symp. on diagnostics of electric machines, 2007, pp. 441-446.

Hillar, R. A. et al, Measurement of the currents flowing in the stator frame of a 500 MW turbogenerator, Proc. IEE, Jan. 1986, vol. 133, Part C, No. 1, pp. 15-25.

Bratoljic, T., Currents induced in the inner stator frame of large turbogenerators by the end zone field, Trans. IEEE, Dec. 1986, EC-1, No. 4, pp. 108-114.

Fairney, W., The soluition of scientific and engineering problems in the development of electrical generating plants, IEE Proc. C, Jan. 1989, vol. 136, Issue 1, pp. 1-8.

Klimman, G. B., et al, A new method for synchronous generator core quality evaluation, IEEE Trans. Energy Conversion, vol. 19, No. 3, Sep. 2004, 576-582.

Maughan, C. V., Root-cause diagonistics of generator service failures, IEEE Int. conf on electric machines, San Antanio, TX, May 2005, 1927-1935.

Stone, G., et al, Electrical Insulation of rotating machines, IEEE Press, 2004, p. 222.

Tavner, P., et al, Condition monitoring of rotating machines, IET Press, 2008, p. 54.

* cited by examiner

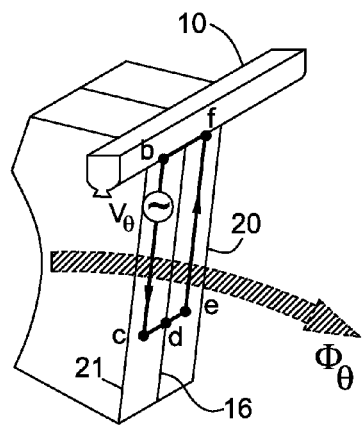
FIG. 1-A
Prior Art
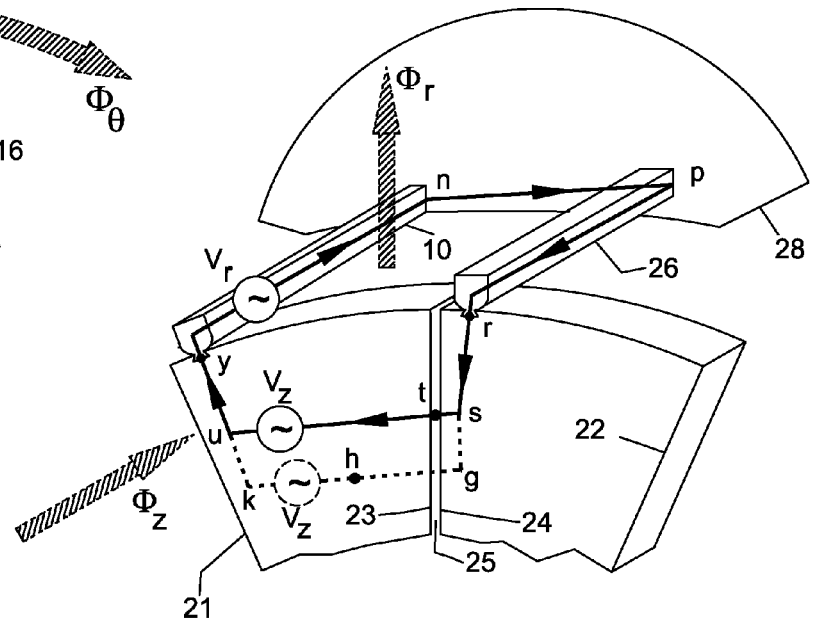
FIG. 1-B
Prior Art
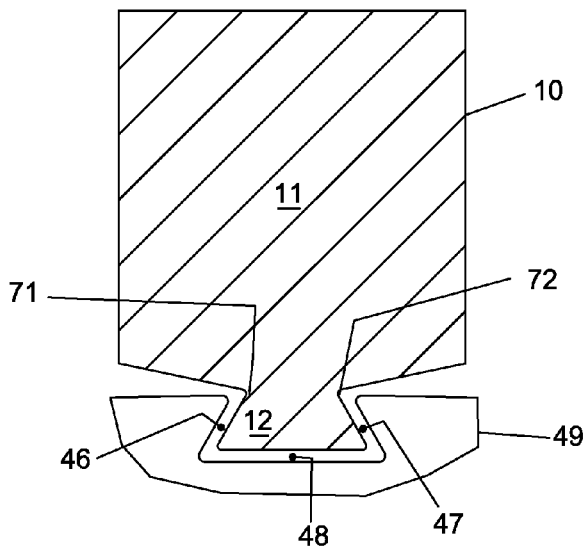
FIG. 1-C
Prior Art
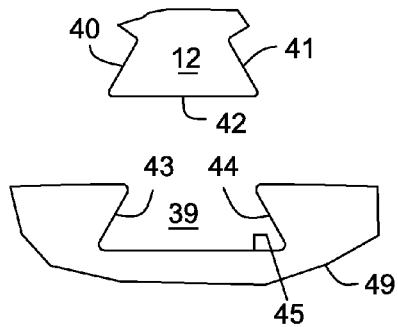
FIG. 1-D
Prior Art

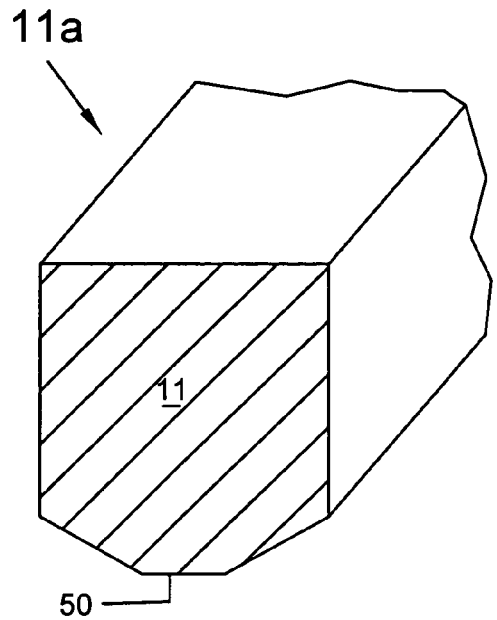
FIG. 2-A
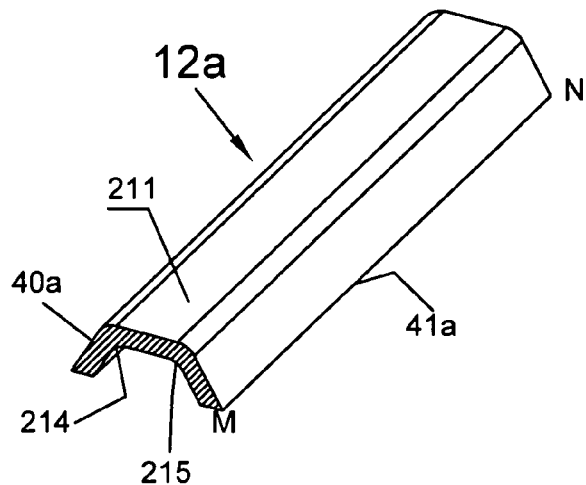
FIG. 2-B
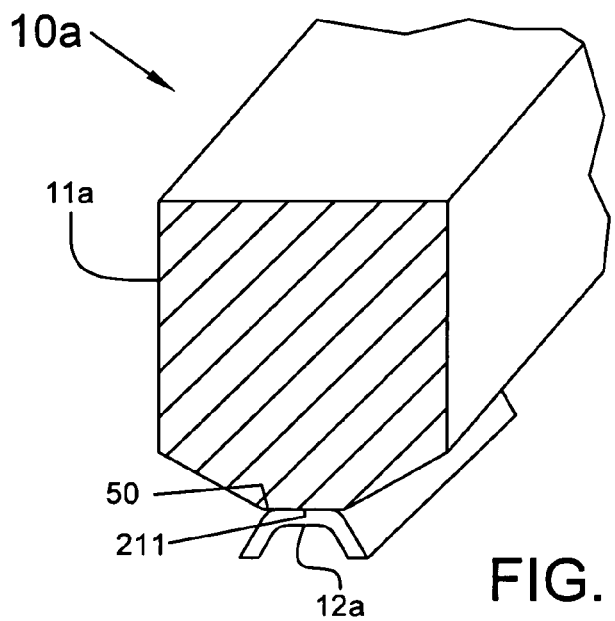
FIG. 2-C

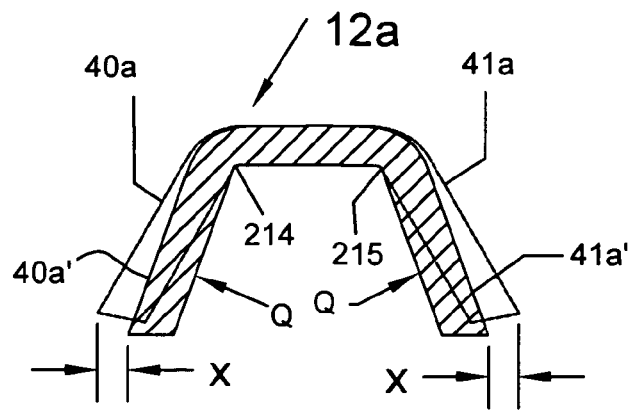
FIG. 3-A
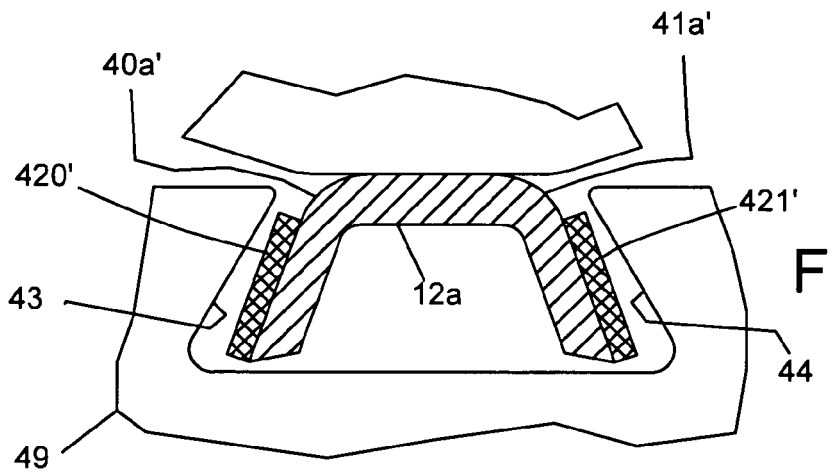
pre-gapped & centered
FIG. 3-B
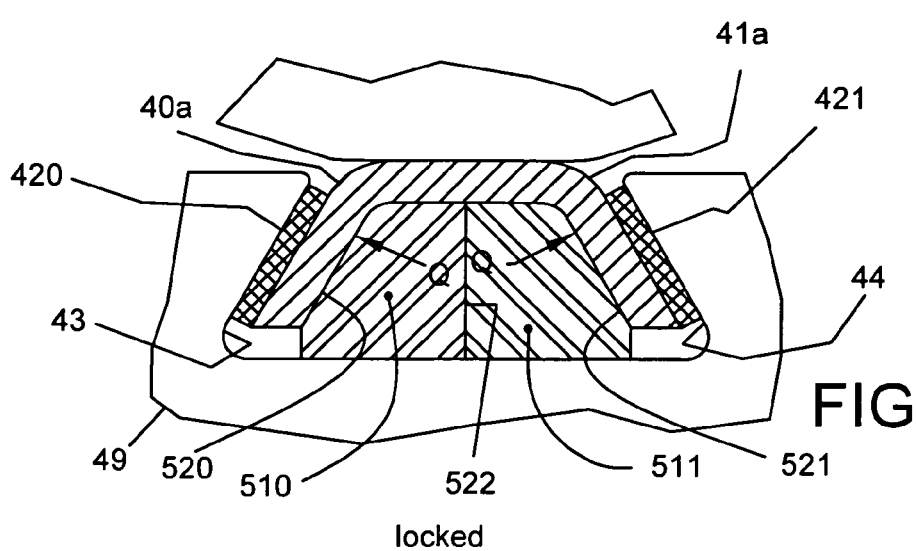
locked
FIG. 3-C

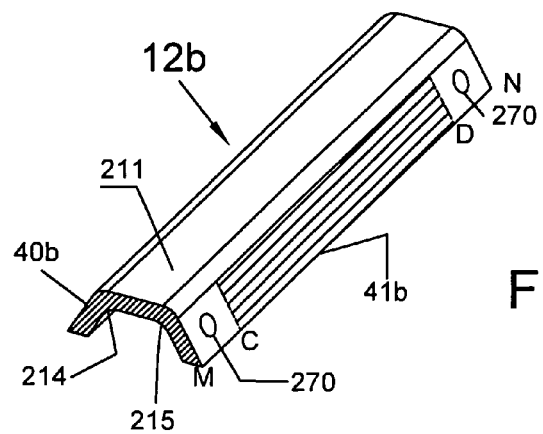
FIG. 5-A
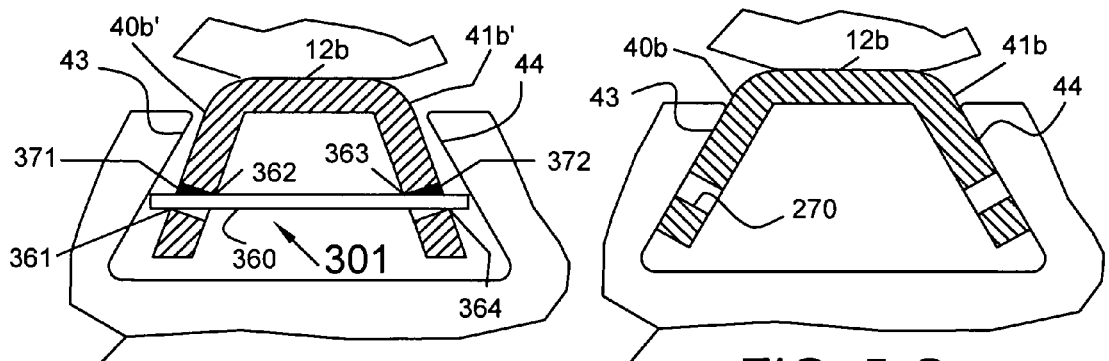
FIG. 5-B
pre-gapped & centered
FIG. 5-C
locked
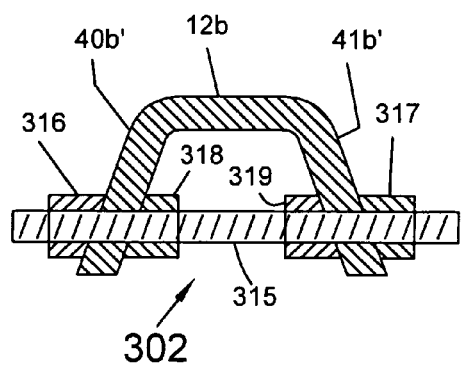
FIG. 5-D

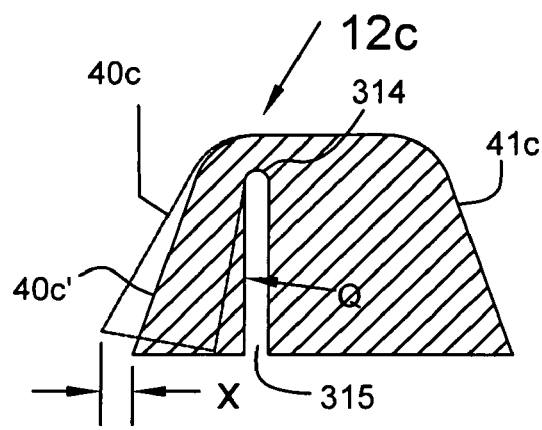
FIG. 6-A
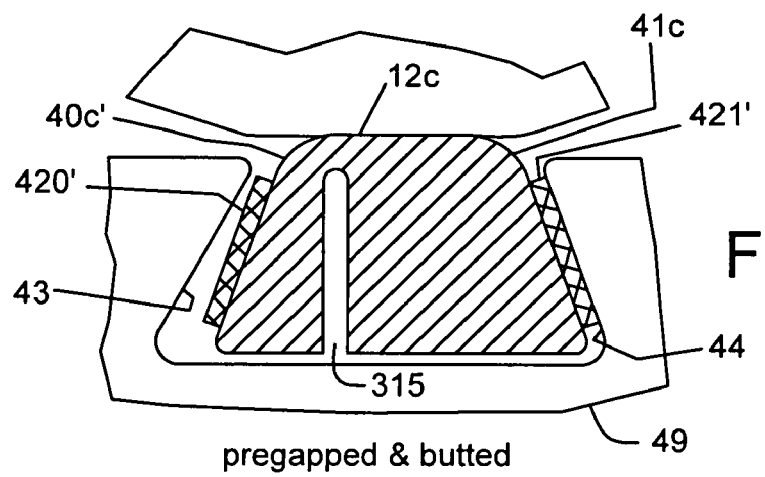
pregapped & butted
FIG. 6-B
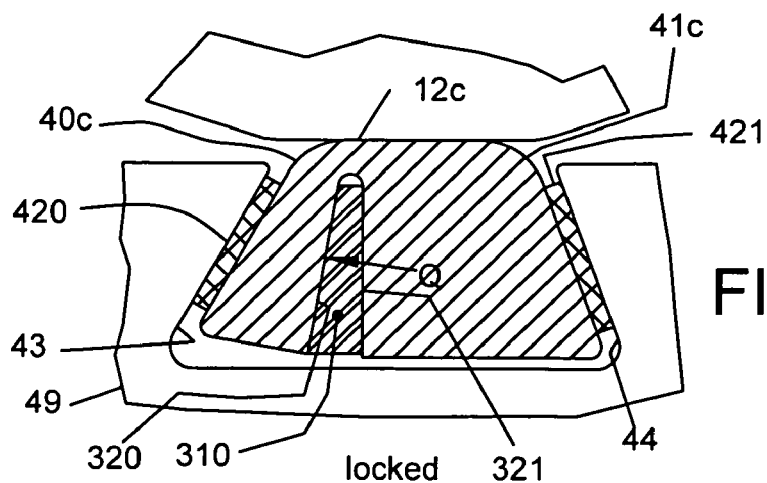
locked
FIG. 6-C

PREVENTION OF CORE FAILURES IN LARGE ELECTRIC MACHINES

FIELD OF THE INVENTION

The present invention relates to preventing core failures in large dynamoelectric machines, particularly those caused by large eddy currents circulating within its laminations and keybars. It also relates to the method of mounting the laminations over keybars.

BACKGROUND

The frame of a dynamoelectric machine contains at its inner periphery an array of keybars, i.e., long metallic rods formed with a bolt portion that compresses the core and mounts the laminations in its dovetail slot. The core is a long hollow cylinder, made of hundreds of thousands of laminations that are punched from an insulated silicon steel strip to a segment shape. At the periphery, each lamination has dovetail slots, one of which engages the dovetail portion in the keybar. The laminations are mounted over the keybars in a circular fashion to form a first annular planar array, each separated by a small air gap called a segment gap. A second annular array is stacked on top of the first and offset from it in a brick wall fashion. Groups of such annular arrays of laminations that are formed either outside or inside a core-pit are termed a "core packet". Multiple core packets separated by spacer bars that create cooling ventilation ducts are stacked axially to form a core stack. A typical core stack is 3 to 10 m (10 to 30 ft) long, comprising 2 to 8 cm (1 to 3 inches) thick core packets, each separated by 0.3 to 1.5 cm (0.125 to 0.5 inches) thick vent ducts, see U.S. Pat. No. 7,567,788. The stator core is formed by clamping the stack between two flanges using the keybars. The core provides a low reluctance path for a rotating magnetic field, which is generated by coils within a rotor that rotates inside the core bore. Under certain extreme operating and manufacturing conditions, the magnetic fields can cause localized heating and melting of the core in a phenomenon known as a core failure. The results of a few known core failures are summarized below.

In 1968, in a power plant operated by Britain's CEGB, a 500 MW generator core was damaged by melting per Fairney (1989). In a simulation of this 500 MW generator, Tavner and Anderson (2005) predicted that keybars in a shorted core could carry thousands of amperes of currents comparable to those carried by the stator bars. In 1998, a 300 MW generator in San Antonio, Tex., overheated because of numerous interlaminar shorts and was removed from service per Spisak (2004). In 2000, a core failure occurred in a 415 MW generator in Castle Dale, Utah, in which about 200 pounds of molten iron flowed out of the core-end, the cause for which was traced to an interlaminar short which grew into a major melt zone per Edmonds et al (2007). These in-depth studies pointed to excessive eddy currents created by shorts as the root cause of core failures.

That the main flux can initiate a core failure is well known [see U.S. Pat. Nos. 4,494,030; 5,252,915 and Edmonds 2007]. FIG. 1-A shows a keybar 10 and laminations 20, 21 with a defect at d at the insulation interface 16 of the stack. The laminations 20, 21 are in electrical contact with the keybar 10 at the points b, f. As the main flux $\phi_\theta$ carried by laminations rotates, it induces eddy voltage $V_\theta = d\phi_\theta/dt$. If $V_\theta$ is greater than the dielectric breakdown voltage $V_b$ of the insulation, then the insulation shorts at d, driving eddy current in a loop bcdef through the keybar 10 and laminations 20, 21. When laminations are shorted, the heat increases in proportion to square of number of shorted laminations, termed multiplier effect. Further, there is no mechanism to remove this eddy heat to the coolant gas. So when large eddy currents flow through a small shorted spot, the local temperature shoots up and burns the insulative coating in adjacent laminations, causing additional axial shorts. As more laminations short axially, the multiplier effect sharply increases the eddy current, increasing the heat, which in turn expands the melt zone axially. The insulation shorts thus amplify eddy currents and expand the melt zone uncontrollably, resulting in a core failure. From FIG. 1-A it can be seen that the keybar/lamination contacts b, f play a pivotal role and make it possible for the eddy currents to close the loop and cause core failure. If these keybar/lamination contacts b, f are broken—by isolating the keybars from laminations—the multiplier effect is suppressed and far less eddy current, confined to individual laminations, will flow, reducing the core failure risk.

That leaking fluxes can also initiate core failure, especially at the core-end, is shown in FIG. 1-B. This figure shows a pair of laminations 21, 22 in a circular array at the core-end. They are electrically connected to a pair of keybars 10, 26 via electrical contacts at y, r. Keybars 10, 26 are also welded to a support ring 28 making electrical contacts at n, p. The segment (or radial edge) 23 of lamination 21 and segment 24 of adjacent lamination 22 are separated by a segment gap 25. Laminations 21, 22 can have two kinds of defects: a segment defect such as t along segments, and an insulation defect such as h along stack. Rotating radial leakage component of flux $\phi_r$ induces a small voltage differential (called keybar voltage $V_r$) between adjacent keybars 26, 10. The rotating fringe flux $\phi_z$ also induces a fringing voltage $V_z$. Both $V_r$, $V_\theta$ combine vectorially to form a larger resultant $V_{eff}$. The paths in which resulting currents flow depend on which parts are in electrical contact. Here keybars are assumed to be in contact with laminations. If $V_{eff}$ is greater than the dielectric breakdown voltage $V_b$, laminations will have insulation short at h and segment short at t. The insulation short at h will cause eddy currents to flow through the six-legged loop ynprghky containing the insulation short h. The segment short at t will cause additional eddy currents to flow through the six legged loop ynprstuy containing the segment short t. Both currents flow through the keybars so keybars will see very large eddy currents. Such large eddy currents flowing through keybars, laminations and flanges (if they are not isolated) cause arcing, pitting and core-end heating per U.S. Pat. Nos. 6,720,699, 6,713,930, and 6,462,457 precipitating a core failure or force one to operate at a lower power level. From FIG. 1-B, it is clear that the keybar/lamination contacts y, r play a pivotal role in enabling the eddy currents to close the loops and cause core failure. If these keybar/lamination contacts y, r are broken—by isolating the keybars from laminations—a far less eddy current confined to individual laminations will flow, reducing the core failure risk.

Preceding analysis reveals that two conditions are necessary for core failure: first, effective eddy voltage $V_{eff}$ must be higher than the dielectric breakdown voltage $V_b$ and second, the keybars should make electrical contact with the laminations. Eliminating one of these conditions could beneficially protect the machine against core failures. Since one cannot eliminate all electrical defects (that control $V_b$)—as hundreds of thousands of laminations are involved—we focus on eliminating the electrical contact of keybars with the laminations (as only a dozen or so keybars are involved). A natural conclusion is that, if the keybar is designed deliberately to be electrically isolated from the laminations, then the risk of core failure is reduced. Then, since limited eddy current flows within individual laminations, the efficiency is increased.

To protect the machine from core failure, direct methods that redirect or cut-off eddy currents (such as conductive cage, insulated keybar) and other indirect methods (such as recoating, overflux monitoring, core end stepping, flux shield, flux shunt, short rotor, higher-grade iron etc) are currently employed. In the recoat method, the core-end laminations are recoated once or twice (after punching and deburring), to nearly double the insulation thickness, hopefully increasing its dielectric breakdown voltage $V_b$ above the eddy driving voltages, hence reducing the core failure risk. Even though laborious and expensive, recoating is the most widely used and proven method. However, the recoat layer itself may embed conductive particles such as iron debris from deburring operation or slivers from punching operation, which reduces the dielectric breakdown voltage, increasing the core failure risk.

Focussing on the direct methods, in the conductive cage method, one inserts a copper strap into each dovetail slot between keybars and laminations (see U.S. Pat. Nos. 6,462,457 and 6,720,699) and coupler wires to connect all straps electrically (see U.S. Pat. No. 6,429,567) to form a conducting cage that surrounds the core to which eddy currents due to leakage flux are hopefully redirected. The straps short all laminations to keybars. However, such shorting of keybars to all laminations unwittingly closes eddy loops and generates more eddy currents, increasing the core failure risk as already described. Further, there is no easy path to transfer the eddy heat from the trapped straps into a cooling medium, so the straps become very hot rapidly. In view of these problems, the conductive cage method is not widely used by the industry.

In the insulated keybar method an insulative media is inserted in the slot between the keybar and laminations (in contrast, a conductive media is inserted in the conductive cage method). This insulative media breaks all eddy current paths between keybar and laminations, reducing the core failure risk and increasing the efficiency. In prior art of the insulated keybar method, three approaches are used: a one-piece insulator, a two-piece insulator and heat shrinkable tubing. U.S. Pat. No. 4,494,030 teaches a one-piece insulator, shaped like a cylindrical tube, covering loosely a round keybar and supported by two thick non-magnetic end plates. However, the non-magnetic plates are exposed to fringe fluxes, so eddy losses will increase, reducing the efficiency. Alternatively, U.S. Pat. No. 7,202,587 describes a two-piece insulator, comprising wedges and a thermoplastic insulative strip in the dovetail slot; wedges tighten the insulative strips. However, the soft insulator strips cannot withstand the severe shear stresses caused by torque forces and can tear apart. Further, the insulating strips can wear out due to abrasive vibrations. A parallel technology taught in U.S. Pat. No. 6,949,858 uses thick heat shrinkable tubing to insulate a through-bolt. However, the keybar's dovetail and bolt portions join at sharp concave corners, which prevents use of shrink tubing to insulate keybars. Because of these limitations of prior-art, it is beneficial to develop new methods of insulation that can withstand the severe shear stresses and abrasive wear of vibratory loads over several years of operating life.

As seen in FIG. 1-C, in prior art, the keybar 10 is a solid steel rod that has a dovetail portion 12 (that engages the slot 39 in a core packet 49) below the corners 71, 72 and a rectangular bolt portion 11 (that engages the support rings 28 and flanges) above the corners 71, 72. FIG. 1-D indicates that the slot 39 in the core packet 49 has slant faces 43, 44 and a flat face 45. The gaps 46, 47, 48 relate the slot faces 43, 44, 45 with respective dovetail faces 40, 41, 42. FIG. 1-C shows a condition in which the slots are bigger than dovetail, so none of the faces of slots 39 contact with respective faces of the dovetail 12 when the slots are centered about the dovetail. There are clear gaps 46, 47, 48 between respective faces. The dovetail/slot gap designer encounters conflicting requirements for designing these gaps 46, 47, 48. For easy assembly, sufficient gap 46, 47, 48 must be provided between respective faces of the dovetail and the slot. However, during operation, for transmitting torque forces, there must be no gap between at least one pair of respective faces (i.e., they must contact each other). A few solutions were proposed in the prior art to address this dilemma. In an earlier U.S. Pat. No. 6,448,686, Dawson used a first prepackaged core packet made of laminations with non-contacting slots, and a second manually stacked core section made of laminations with contacting slots. The non-contacting slots enable one to insert and center the prepackaged core packet over the dovetails. All these non-contacting laminations are held to the frame by the stacking pressure. However, it was found that the stacking pressure reduces as the machine ages, leading to loose laminations that rattle. Hence, in later U.S. Pat. Nos. 6,597,081 and 6,775,900 Dawson discarded the concept of concentrating non-contacting slots in prepackaged core packets; instead, laminations with non-contacting slots are intermixed with those which have contacting slots, with intermixing carefully controlled to distribute the contact points evenly. Obviously, such selective positioning of contact points evenly among hundreds of thousands of laminations is very labor intensive and hence expensive. Further, this approach still did not solve the loose lamination problem, as non-contacting laminations are still present in the stack and can become loose and rattle. To overcome this rattling laminations problem, the patent application 2011/0109187 by Tanavde teaches compression bands (comprising a strap, cable and tightening means) or belts around the keybar cage, whose tightening forces the dovetails to contact and press against lamination slots, thereby removing the looseness and preventing laminations from rattling. However, this belt-tightening forces the keybar to contact laminations, which enables eddy currents in shorted laminations to close the paths, thereby increasing the eddy currents and hence has the unfortunate side-effect of increasing the core failure risk and reducing the efficiency. All these problems of rattling laminations, core failure risk, reduced efficiency and the added cost of manufacturing and installing the compression bands could be eliminated by attaching the laminations to insulated keybars (i.e., respective slanted faces press against each other tightly) in the first place as proposed in the present invention.

SUMMARY OF THE INVENTION

A major objective of the present invention is to describe a method of assembling the stator core that reduces the risk of core failure. Another objective is to prevent loose laminations from rattling. Another objective is to prevent large eddy currents from flowing through keybars. Another objective is to prevent eddy currents from causing core-end heating. Another objective is to isolate the frame from vibrations of the core. Another objective is to permit easy disassembly of the core for servicing and repair. Another objective is to reduce the cost of assembling the stator core. Another objective is to increase the efficiency of the machine. To meet these objectives, this invention presents two unique members—a bald keybar and a mini-dovetail. The present invention splits the conventional keybar into a bald keybar containing the bolt portion only, and flexible mini-dovetails replacing the rigid dovetail portion.

Bald keybar is a long bolt that is used in compressing the core. It has the same size and shape and made of same material as a conventional keybar, but has its bolt-portion only. On the side facing the core packet, the bald keybar tapers to a narrow flat face up to the neck, the width of which is defined by the slot opening in a core packet. Bald keybar has threaded ends to facilitate clamping laminations between flanges.

Mini-dovetail is a member that mimics a small portion of the conventional dovetail, but has flexible slanted arms. The primary function of mini-dovetail is to lock one core packet and, with insulation added, to protect the machine against core failure, prevent core-end heating and increase the efficiency. The length of mini-dovetail equals the span of vent ducts. The mini-dovetail is a metal body with a trapezoidal cross-section with a long side, short side and two symmetric slanted faces, with a cutout that starts from the long side and extends towards the short side. The cutouts are shaped to form one or two areas containing least amount of metal; these areas are termed roots. The cutout shapes the body into a bow-shape; subdivide it into two slanted arms at ends joined in the middle by a root portion on the short side. The slanted arms are designed to be flexible around the roots to open and close the gap and lock the core packet. The thickness of metal in the root defines the stiffness of the flexing arms. In a preferred embodiment, the cutout is a symmetric trapezoid with two corners defining smallest thickness of metal. This produces a mini-dovetail with a bow-cross section, having two slanted arms that flex around respective roots to extend or reduce the distance between respective tips. In another embodiment, the cutout is in the form a non-symmetric blind slot with one corner, which produces one slanted arm that can flex, while the other arm is rigid and inflexible. The width of the root portion on the short side is defined by the neck of the slot in the core packet. The neck face of the root portion is secured to the respective neck face of the bald keybar. The size, shape and angle of slanted arms are defined by respective slanted faces of the slot in the core packet. The slanted faces of the mini-dovetail and those in the slot define respective contact areas, which transmit the torque forces and dead weight of the core. Mini-dovetails are augmented by actuators and insulators.

Actuator is any means used to flex the slanted arms of the mini-dovetail, thereby expanding or contracting the distance between them. This enlarges or reduces the gap between respective slanted faces of the mini-dovetail and the slot. The actuator can be configured in several embodiments using a variety of members such as wedges, pins, bolts, setscrews, welds etc. The actuator for an under-sized mini-dovetail, termed expander, expands the slanted arms to contact lock the core packet. The actuator for an oversized mini-dovetail, termed constrictor, holds the mini-dovetail in a pre-compressed or non-contacting position, with slant arms compressed and bent inwards, which creates a clear gap between the mini-dovetail and slot which is exploited to center the core packet. Constrictor thus transforms an oversized mini-dovetail to a pre-gapped mini-dovetail. The constrictor is then removed to bring the mini-dovetail from pre-gapped position to the locked position, thereby locking the core packet. The slanted faces of the dovetail arms are optionally covered with an electrically insulative medium to protect against core failure.

An insulator is any insulative medium applied over the slanted faces of the mini-dovetail to reduce the core failure risk. The insulative medium prevents electrical contact between the respective surfaces of the mini-dovetail and the slots that are in mechanical contact. The insulative medium can be in the form of an insulative strip, a compressible insulative medium or a coating. A compressible insulation can be used to isolate the frame from vibrations of the core. The stiffness and damping properties of compressible insulation are then adjusted to meet the vibration isolation and load transmission requirements.

In the method of forming the stator in accordance with the present invention, plurality of bald keybars are secured to the frame to form a bald keybar cage. Under-sized mini-dovetails, with the slanted faces having an insulating medium, are mass-produced in a separate facility. A first peripheral array of the mini-dovetails is then secured to the bald keybars around the periphery. A first core packet with duct spacers is then prepared in-situ or outside with laminations centered over the mini-dovetails. The laminations are pre-compressed at elevated temperatures. The pre-compressed laminations are then locked to these mini-dovetails by expanders. A second peripheral array of undersized mini-dovetails is then secured to bald keybars on top of first array of mini-dovetails. A second core packet with duct spacers is then stacked and locked to the second peripheral array of mini-dovetails in a similar fashion. Several core packets are stacked in this manner to form the core. The core is then clamped at the ends between the flanges by tightening nuts on the protruding threaded ends of the bald keybars.

In the description that follows, several embodiments of mini-dovetail, actuator and insulator will be presented. The invention encompasses any combination of these members but not limited by the embodiments presented.

BRIEF DESCRIPTION OF THE DRAWINGS

For a better understanding of the nature and objects of the present invention, reference may made to the accompanying schematic drawings in which:

FIG. 1 indicating the prior-art, with FIG. 1-A showing a perspective view of two laminations shorted axially, FIG. 1-B showing perspective view of two laminations shorted circumferentially, both views illustrating typical eddy current paths, FIG. 1-C showing a cross-sectional view of a conventional keybar centered in the slot of a core packet, FIG. 1-D showing respective faces of the dovetail and the slot, FIG. 2 showing the bald keybar and a preferred embodiment of a mini-dovetail with two flexible arms, with FIG. 2-A showing an isometric view of a bald keybar, FIG. 2-B showing an isometric view of the bow-shaped mini-dovetail, FIG. 2-C showing an isometric view of the mini-dovetail secured to the bald keybar, FIG. 3 showing the method of locking the core packet to a mini-dovetail, with FIG. 3-A illustrating sectional view of a mini-dovetail showing how flexing of the slanted arms of a mini-dovetail expands them, FIG. 3-B showing a sectional view of a core packet and a pre-gapped mini-dovetail in centered position with respective slanted faces not contacting, FIG. 3-C showing sectional view of the same core packet and mini-dovetail in locked position, with respective slanted faces contacting and pressing against each other, FIG. 4 showing a sectional view of the assembled stator, with a core packet locked by a peripheral array of mini-dovetails and bald keybars, FIG. 5 showing an alternative embodiment of the two-armed mini-dovetail and method of locking a core packet, with FIG. 5-A showing an isometric view of the alternative mini-dovetail, FIG. 5-B showing a sectional view of this mini-dovetail and core packet in centered position, held in pre-compressed position by a constrictor, FIG. 5-C showing a sectional view of this mini-dovetail and core packet in locked position, with the constrictor removed, FIG. 5-D showing a second embodiment of an actuator with a pair of nuts controlling the position of each slanted arm, FIG. 6 showing an alternative embodiment of a mini-dovetail with one flexible arm and method of locking a core pocket, with FIG. 6-A showing a cross-sectional view of this mini-dovetail, FIG. 6-B showing a sectional view of this mini-dovetail and core packet in butted position, FIG. 6-C showing this mini-dovetail in locked position with the core-packet.

DETAILED DESCRIPTION OF THE INVENTION

Figure 4:
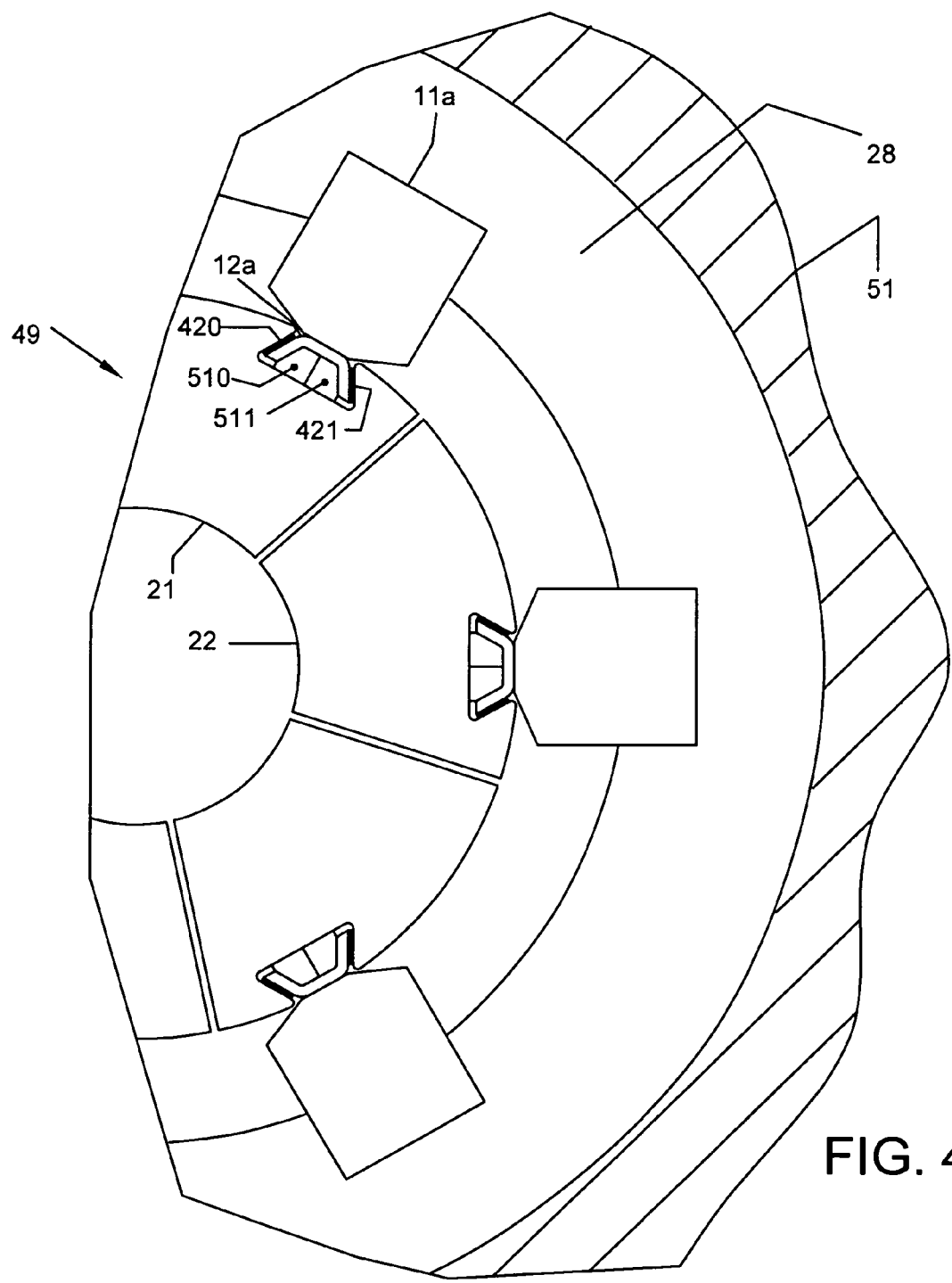

FIG. 2-A shows the bald keybar 11a to compress the core and transmit the loads from core to frame. It is a conventional keybar 10 without the dovetail 12 (see FIG. 1-C). Its size and shape is identical to the solid bolt portion 11 of the conventional keybar 10. It is made of same material and has threaded ends as in conventional keybar. A peripheral array of bald keybars 11a is secured to the frame 51 by welding to the support rings 28 and form a bald keybar cage as shown in FIG. 4. Bald keybar 11a has a narrow face 50 corresponding to the neck of the conventional keybar; this face is machined flat. Optionally machining of the face 50 can be done in-situ after the bald keybars are welded to the support ring, thereby avoiding any weld distortions affecting the flatness of faces 50 and roundness of array of bald keybars. Faces 50 of array of bald keybars could define a reference round surface for building the core. Since the bald keybar 11a has no dovetail, it is simpler and less expensive to manufacture. Further, with it installed in the frame, the core packets need not be forced to slide axially over long lengths of the dovetail's slant faces. Its use hence reduces the labor and material costs.

FIG. 2-B shows a preferred embodiment of mini-dovetail 12a. This particular mini-dovetail 12a has a trapezoidal strip cross-section. The purpose of a mini-dovetail is to provide flexible faces used in locking a core packet; with insulator added, it also protects against core failure and increases the efficiency. The mini-dovetail mimics a small portion of the conventional dovetail corresponding to the pitch of the ventilation ducts (each 1 to 3 inches long). Plurality of short mini-dovetails 12a replaces the conventional dovetail 12 (each 10-30 ft or 3 to 10 m long). The axial length MN of the mini-dovetail equals so it spans a single core-packet. The trapezoidal strip section forms two corners 214, 215 subdividing the mini-dovetail 12a into two flexible or slanted arms 40a, 41a separated by a root portion 211 in the middle. The face width of the root 211 is defined by the neck of the slot 39 in a core packet 49. From now onwards reference numbers 40a, 41a refer to the slanted arms or its outer faces depending on the context. The neck face of the root portion 211 is secured to the respective neck face 50 of the bald keybar. The slanted faces 40a, 41a of mini-dovetail 12a are similar to the slanted faces 40, 41 of conventional mini-dovetail 12. These slanted faces 40a, 41a are related to the respective slanted faces 43, 44 of the slot 39 in the core packet 49 by respective gaps. Optionally the surfaces of the slanted faces 40a, 41a can be roughened to increase the frictional force in respective contact areas. The slanted faces 40a, 41a are preferably insulated by keybar insulators to protect the machine from core failure. The slanted arms 40a, 40b can flex around respective corners 214, 215. The flexing or movement is controlled by its stiffness, which it self is controlled by the thickness of the trapezoidal strip. The thickness is chosen so that the arms can be flexed to cross from a pre-gapped position to a locked position. Because the slanted arms are flexible, the mini-dovetail can be in one of two conditions: (a) Undersized: The flexible arms of the mini-dovetail do not contact with respective slant faces of the slot (also synonymously called as oversized slot, non-contacting mini-dovetail, pre-gapped mini-dovetail) (b) Locked: The flexible arms of the mini-dovetail make contact and press against respective slant faces of the slot over sufficiently large contact areas with sufficiently large compressive force. The mini-dovetail can be manufactured in several ways. The mini-dovetail 12a can be made from a strip of spring steel such as 1095 and heat-treated to produce flexible slanted arms. Alternatively, it can be made from a strip of steel formed with two corners 214, 215 to the shape of a bow or dovetail. Alternatively, it can be made by bending a steel strip around the corners 214, 215 or by stamping a spring steel sheet to the bow shape as shown. Alternatively, it can be made from a trapezoidal slab with a trapezoidal cutout. FIG. 2-C shows the mini-dovetail 12a secured to a bald keybar 11a to form the keybar 10a. The flat face of the root 211 of mini-dovetail 12a is secured to the flat face 50 of bald keybar 11a. Conventional techniques such as welding, riveting, bolting etc. can be used for this attachment.

FIG. 3-A shows how the flexible arms 40a', 41a' of a pre-gapped mini-dovetail 12a are flexed around the corners 214, 215 to expand them to the locked position 40a, 41a. FIG. 3-B shows a pre-gapped mini-dovetail in the centered position after the insulator 420', 421' are installed on the faces 40a', 40b'. In this position, there will be a small but clear gap between the respective slant faces 420', 421' of the mini-dovetail's insulators and the slot faces 43, 44. This clear gap will enable one to center the core packet over the mini-dovetails. To lock a core packet, a compressive force Q has to be applied normal to the inside surfaces of the flexible arms which moves the insulated faces from pre-gapped position 40a', 41a' to the locking position 40a, 41a. In this process, the insulator is also moved from pre-gapped position 420', 421' to the locking position 420, 421. Each mini-dovetail has an expander whose sole purpose is to apply this compressive force Q. FIG. 3-C shows an expander in the form of a pair of wedges 510, 511. These slant faces 520, 521 of wedges 510, 511 conform to the respective inner surfaces of the slanted arms 40a, 41a. The wedges are split to form sliding surfaces at the mid-line 522 of the mini-dovetail; these sliding surfaces are tapered along the longitudinal axis and produce the displacement x of slanted arms 40a', 41a'. These wedges are driven axially to lock the core packet to the mini-dovetail. The act of wedging expands the arms to 40a, 41a as shown in FIG. 3-C. The design of wedges, material selection and manufacturing is a well-known art. The wedges not only lock the core packet but also prevent local vibrations of the core packet against flexible dovetail arms.

FIG. 4 is a cross-section of a stator after a core packet is centered and locked to the mini-dovetails and hence secured to the frame. The procedure to assemble the stator in a core pit will be described when the frame axis is vertical, synchronized with the gravity axis. However, the procedure is equally applicable when the stator is assembled with the frame axis horizontal. The assembly starts with a stator frame 51 with built-in support rings 28 in the core pit. A set of bald keybars 11a are secured to the support rings 28 around the periphery. Insulated mini-dovetails, i.e., pre-gapped mini-dovetails 12a with the insulative media 420, 421 attached to its arms are manufactured separately. An array of these mini-dovetails are then secured to respective set of bald keybars 11a. A disc-shaped support table (not shown) is laid under this array and individual laminations or groups of laminations are laid in centered position over the pregapped mini-dovetails, resting on the support table. The gap in the pre-gapped mini-dovetail allows the core packet 49 to be positioned and centered over an array of mini-dovetails without contacts at respective slanted faces. Individual core packets are compacted by a hydraulic press at elevated temperature after centering as known in the art. The tapered wedges 510, 511 are then driven in the interior space of the arms of the mini-dovetails 12a with the laminations in compacted and pre-compressed position. This act of driving the wedges applies compressive force Q that traps the clamping pressure and locks the core packet 49 against the mini-dovetail arms with the insulation 420, 421 in between. The second core packet is assembled in a similar manner over the first core packet. The core stack is built by repeating these steps, and is compressed and clamped between flanges by tightening the flange nuts over the threaded ends of bald keybars. It must be noted that even though FIG. 4 shows a specific bow-shaped mini-dovetail with a specific actuator and specific insulator mounted on it, a person skilled in the art could use any combination of flexible mini-dovetails, insulators and actuators to center the core packet and lock a pre-compressed core-packet tightly over the mini-dovetails.

FIG. 5-A shows an alternative embodiment of an oversized mini-dovetail 12b, i.e., one with slanted faces 40b, 41b outside respective slanted faces 43, 44 of the slot 39. In order to center the core packet over such mini-dovetails, the arms are squeezed and held in precompressed or non-contacting position 40a', 41a'. This squeezing can be done for example by clamping the mini-dovetail 12a in a vice and tightening the arms of the vice. A constrictor holds this mini-dovetail in the precompressed position, i.e., holds the precompressive force that bent the mini-dovetail arms to the position 40a', 41a'. This creates a gap between respective faces of mini-dovetail 12a and the slot 39. That is, respective faces of the slot and the mini-dovetail do not contact each other. After centering the group of laminations over the mini-dovetail as shown in FIG. 5-B, the constrictor is removed to release the pre-compressive force, and the slanted arms spring back to the position 40a, 41a, thereby locking the core packet (FIG. 5-C). Note that even though FIG. 5-B, 5-C show a mini-dovetail without insulator, the method of centering and locking the core packet can be equally applied to an insulated mini-dovetail, with an insulator applied over the faces 40a, 41a.

FIG. 5-B shows a preferred embodiment 301 of a constrictor in the form of a dowel pin 360. To insert the dowel pin, two holes 270 are drilled normal to the slanted faces 40a, 41a. These holes are located in the space MC and ND [see FIG. 5-A] near the edges, outside the space CD corresponding to the core packet 49. The oversized slanted arms 40a, 41a are then squeezed inwards to the position 40a', 41a' by the precompressive force so that it becomes a pre-gapped mini-dovetail. The dowel pin 360 is slightly oversized, i.e., bigger than the diameter formed by these corners. The oversized dowel pin is hammered through the holes 270 after the mini-dovetail is pre-compressed. In this process, it deforms the metal locally at the corners 361, 362, 363, 364, which then holds the precompressive forces by friction. Alternatively, the dowel pin 360 can be welded at 371, 372 within the holes 270 for better reliability. The core packet 49 is then centered over the mini-dovetails. After centering and compacting the laminations, the dowel pin 360 is sawed off or broken into two pieces. The pieces can be left in place if they are welded or removed if they are held by friction. This act of breaking the dowel pin releases the pre-compressive force and the slanted arms 40a', 41a' spring back to the initial position 40a, 41a, thereby locking the core packet with the mini-dovetails [see FIG. 5-C]. The dowel pin embodiment 301 of the constrictor needs only one part and hence is the simplest. However, more complex embodiments of constrictor, involving more number of parts, can be conceived with added functions such as controlling the force that presses respective slant faces against each other.

FIG. 5-D illustrates an alternative embodiment 302 of an actuator. Actuator embodiment 302 is a threaded rod assembly comprising a threaded rod 315 and four nuts 316, 318, 317, 319 inserted into holes 270 that are drilled straight. Two nuts 316, 318 sandwich the arm 40a', while two other nuts 317, 319 sandwich the arm 41a'. Optionally the nuts can be machined slanted to contact the slanted arms as shown in FIG. 5-D. By tightening or loosening nuts 316, 318, one can precisely move the arm 40a' inwards or outwards. Similarly by tightening or loosening nuts 317, 319, one can precisely move the arm 41a' independent of that of the arm 40a. Such precise and independent control of the position of individual arms will be useful when there are large scatter and tolerance variations. Where such precise control is not needed, one can use an actuator with only two nuts. One such configuration uses and pre-gapped mini-dovetails with threaded rod 315 and two inside nuts 318, 319 only. This pre-gapping allows the core packet 49 to be centered over the mini-dovetail 12a. The nuts 318, 319 are then tightened against the arms 40a', 40b' to expand the arms to the position 40a, 41a, thereby locking the core packet 49.

FIG. 6-A shows an alternative embodiment of the mini-dovetail 12c having a single flexible arm 40c'. This form of mini-dovetail can be made from a metal slab of trapezoidal cross-section with a non-symmetric cutout 315 that starts from the longer side and extends towards the shorter side up to the corner 314 in the form of a blind slot. The blind slot 315 divides the mini-dovetail into one flexible arm 40c' that flexes around the corner 314 and another non-flexible arm 41c that does not bend. FIG. 6-B shows this mini-dovetail 12c with insulated strip 420', 421' on the flexible and rigid arms 40c', 41c. After the dovetail 12c is mounted over the bald keybars, single or groups of laminations are butted against the rigid arm 41c, with the slanted insulator 421' contacting the respective slanted face 44 of the laminations. These slanted faces in contact transmit the torque forces and dead weight. The core packets so positioned are then compressed and compacted as well known in the art. FIG. 6-C shows the mini-dovetail 12c locked to such core packets by a wedge 310. The wedge 310 is tapered so that at one end, it fits into the unexpanded blind slot 315 and at other end, it fits into the expanded blind slot formed by faces 320, 321 of the arms 40c, 41c. This form of mini-dovetail 12c essentially allocates one rigid arm 41c to butt against the lamination to transmit the torque forces and dead weight while the other flexible arm 40c is used to carry the precompressive load on the core packet and lock it.

The primary function of a keybar insulator is to isolate the keybar electrically from laminations. In an oversized mini-dovetail, the insulator is applied only over the contact portion CD of a mini-dovetail. This allows the area MC, DN to be used by the constrictors without interference from the insulator. As already indicated, the prior-art used soft thermoplastic insulators with low abrasive wear resistance. In contrast, the present invention preferentially uses insulators with high abrasion resistance. Such insulators can be incompressible or compressible.

A preferred keybar insulator embodiment is an insulative strip engaged to the slanted faces 40a, 41a of a mini-dovetail. Such insulative strips are preferably made of alumina as it can withstand the severe stresses encountered in the operation. Mass production of alumina strips are a well-known art widely used in the electronics packaging industry. A strip need not be bonded to the slanted faces so it can avoid the differential thermal expansion problem. Another keybar insulator embodiment is a mini-dovetail shaped compressible cap that conforms and wraps over the slanted faces 40a, 41a of the mini-dovetail. It can be made of insulative materials such as elastomers, which are reinforced with harder materials to achieve desired hardness. Its hardness is chosen so that the insulator can be compressed just enough to bridge the gap between the dovetail and slots. It is molded to conform to the dovetail shape of a mini-dovetail's slanted arms undersized. To jacket the insulator over the slanted arms, the undersized cap is expanded and slipped over the slanted faces. Once jacketed, it clings tightly to the slanted faces. Alternatively, it can be bonded to the slanted faces 40a, 41a using known chemical bonding means such as those described in the U.S. U.S. Pat. No. 4,349,403. The compressible cap insulator can be designed to serve multiple purposes: a) as a vibration isolator that isolates the keybar from the vibrating core, b) as a flexible member that compresses to lock the laminations c) as a keybar insulator that insulates the keybar from the core packet laminations. The cap or strip insulator is preferable as they obviate the differential thermal expansion problem. Alternative insulator embodiment is a coating over the slanted faces of the mini-dovetail. The coating should be thick enough to sustain the abrasive wear expected during tens of years of service. This abrasive wear is minimized by choosing materials with high abrasive wear resistance. It is well known that abrasive wear resistance of alumina is far superior to that of thermoplastics. Therefore, a thin alumina coating wears less than thick thermoplastic. A 15 to 25 mil (0.5 mm) thick alumina is equivalent to a 0.35" (9 mm) thick thermoplastic insulator used in the U.S. Pat. No. 6,949,858. A worn insulation also introduces a gap between laminations and dovetail, which could result in rattling laminations. Thus a thin alumina coating is preferable over a thick thermoplastic insulator used in the prior art. Several techniques can be used to apply alumina coating, such as those detailed in U.S. Pat. No. 5,336,560 and include thermal spray, brazing, laser processing etc. One can optionally employ a two-layer coating as in the patent application 20090110903. In this, a top hard layer is made of alumina for abrasion resistance, a bottom soft layer is made of aluminum, and other materials to fight thermal expansion induced stresses. The primary concern with coatings however is the differential thermal expansion leading to their cracking and eventual destruction. Besides, it is difficult to produce coatings that do not delaminate under severe shear stresses.

The mini-dovetail 12a has several advantages over conventional dovetail 12. The slant faces 40, 41 of conventional dovetail 12 have to meet stringent flatness requirements. For example, they must be flat to a few mils over a long length of 10 to 20 ft or more to engage dovetails with slots. Holding the flatness so tightly over long lengths is labor-intensive and expensive to manufacture. The mini-dovetails on the other hand require same degree of flatness over a much shorter length of 1 to 4 inches (corresponding to core packet thickness). Achieving few mils of flatness over few inches of mini-dovetail 12a is far easier to achieve than over tens of feet of conventional dovetail 12. Therefore, the mini-dovetail is more economical to manufacture. Further, the mini-dovetail 12a does not suffer from the weld-distortion seen by the conventional dovetail 12. Another fundamental advantage of the mini-dovetail is that ensures uniform transmission of torque forces from the core to the frame. In addition, the method of assembly of the core described herein produces evenly distributed contacts, so spreads the torque forces uniformly while preventing core failure, increasing the efficiency and reducing the overall cost.

What I claim is:

1. A dovetail member for a keybar of a dynamoelectric machine, the dovetail member being configured to be locked to a dovetail slot of a core packet of the dynamoelectric machine, the dovetail member comprising:
    a trapezoidal strip having a root section and two slanted faces defined by the respective slanted faces of the dovetail slot;
    wherein said slanted faces formed by at least one flexible arm that flexes around and connected together at the root section, said root section and said slanted faces define an opening inside the dovetail slot, and
    wherein the dovetail member being configured to engage to the keybar of the dynamoelectric machine via a flat surface of the root section.

2. The dovetail member of claim 1, further comprising an actuating means for controlling movement of the flexible arms.

3. The dovetail member of claim 2, wherein the actuating means comprising at least one wedge conforming to the opening inside of the dovetail slot so that the actuating means enables to expand at least one flexible arm outwards.

4. The dovetail member of claim 2, wherein the actuating means comprising a bolt inserted through holes formed in the flexible arms of the dovetail member, wherein the bolt further inserted through at least one pair of nuts, and the at least one pair of nuts sandwich the flexible arms of the dovetail member, whereby tightening or loosening of at least one pair of nuts controls the movement of the flexible arms inwards or outwards.

5. The dovetail member of claim 4, wherein each nut butts against the inside face of the corresponding flexible arm, whereby the tightening of the nut expands the flexible arm outwards.

6. The dovetail member of claim 1, further comprising constraining means configured to hold the flexible arms in a precompressed state, said constraining means comprising one or more of a pin, a bolts, a setscrew, a weld, wherein removal of the constraining means expands the flexible arms outwards.

7. The dovetail member of claim 1, further comprising an insulative medium engaged to the slanted faces.

8. The dovetail member of claim 1, wherein the dovetail member has a trapezoidal cross section embedding a blind slit, the depth and position of the blind slit defining one flexible arm and one non-flexible arm interconnected by the root section.

9. A stator of a dynamoelectric machine, the stator comprising:
    a stator frame;
    at least one support ring supported in said stator frame and having slots arranged in the periphery of an outer surface of the at least one support ring;
    a set of kebars secured in the slots of the at least one support ring;
    a group of laminations each having a dovetail slot formed therein; and
    a set of dovetail members, each dovetail member comprising:
        a trapezoidal strip having a root section and two slanted faces defined by the respective slanted faces of the dovetail slot of the lamination, said slanted faces formed by at least one flexible arm that flexes around and connected together at the root section, said root section and said slanted faces define an opening inside the dovetail slot;

wherein each dovetail member is secured to one of the keybars of the dynamoelectric machine via a flat surface of the root portion; and wherein each dovetail member is locked to one of the dovetail slots of lamination.

10. A method of assembling a stator of a dynamoelectric machine, the method comprising:

securing at least one support ring to a stator frame, the at least one support ring having slots arranged in the periphery of an outer surface of the at least one support ring;

securing a set of kebars in the slots of the at least one support ring;

securing a set of dovetail members to the set of kebars; and securing a group of laminations each having a dovetail slot formed therein to the dovetail members;

wherein each dovetail member comprising a trapezoidal strip having a root section and two slanted faces defined by the respective slanted faces of the dovetail slot of the lamination, said slanted faces formed by at least one flexible arm that flexes around and connected together at the root section, said root section and said slanted faces define an opening inside the dovetail slot.

* * * * *